United States Patent
Devany et al.

(10) Patent No.: US 7,214,552 B2
(45) Date of Patent: May 8, 2007

(54) ELIMINATING SYSTEMATIC PROCESS YIELD LOSS VIA PRECISION WAFER PLACEMENT ALIGNMENT

(75) Inventors: Christopher Devany, Mechanicsville, VA (US); Charles E. Venditti, Mechanicsville, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 84 days.

(21) Appl. No.: 10/992,982

(22) Filed: Nov. 19, 2004

(65) Prior Publication Data
US 2006/0110836 A1    May 25, 2006

(51) Int. Cl.
*G01R 31/26* (2006.01)
(52) U.S. Cl. .......................................... 438/14; 438/18
(58) Field of Classification Search ................ 438/400, 438/14–18
See application file for complete search history.

(56) References Cited

U.S. PATENT DOCUMENTS

| | | | | |
|---|---|---|---|---|
| 5,194,743 A | * | 3/1993 | Aoyama et al. ............. | 250/548 |
| 6,389,366 B1 | * | 5/2002 | Heavlin ....................... | 702/84 |
| 6,629,053 B1 | * | 9/2003 | Mooring ...................... | 702/94 |

* cited by examiner

*Primary Examiner*—H. Jey Tsai
(74) *Attorney, Agent, or Firm*—Brinks Hofer Gilson & Lione (57) ABSTRACT

A method for a semiconductor process includes correlating yield loss for the performance of a processing step in a semiconductor manufacturing process with the mechanical placement of the semiconductor substrate and, based on the correlation, placing semiconductor substrates in a position with sufficient placement precision to reduce yield loss below a predetermined threshold.

13 Claims, 5 Drawing Sheets

ELIMINATING SYSTEMATIC PROCESS YIELD LOSS VIA PRECISION WAFER PLACEMENT ALIGNMENT

BACKGROUND

The present application relates generally to semiconductor device processing. More particularly, the present invention relates to eliminating systematic process yield loss via precision wafer placement alignment when processing semiconductor devices.

Processes to define electronic devices and interconnect on and near the surface of semiconductor substrates or wafers are well known. Such processes including patterning the surface using photoresist, etching materials by photolithography, ion implantation to define devices and film deposition and patterning for interconnect. These processes are generally well understood and are under constant refinement to improve yield. Yield is the percentage of good semiconductor chips produced from a substrate. These and other processes are also under refinement to allow definition of ever smaller geometries.

Two methods for achieving smaller geometries are by defining more vertically oriented devices, and by improving the electrical isolation between devices. This can be done by etching deep trenches in the surface of the semiconductor substrate. In subsequent process steps, the trenches can be filled with different materials to achieve desirable effects. For example, a trench filled with an insulator such as silicon dioxide will electrically isolate adjacent silicon islands, reducing the electrical interaction of devices built therein. As another example, a trench filled with a conducting layer such as polysilicon which is separated in the trench with a thin insulating oxide can form a charge storage capacitor for a dynamic random access memory.

One conventional method of forming deep trenches on semiconductor surfaces is by plasma etching. Plasma etching occurs in an evacuated chamber in which a wafer is placed on an electrostatic chuck (ESC) which forms the cathode of a parallel plate plasma reactor. The ESC is cooled internally, by liquid cooling systems, to manage the temperature of the wafer. Heat is carried away from the back side of the wafer while the front side is being etched. A gas plasma is introduced to the chamber to provide ions or free radicals for the etching process. Radio frequency energy is applied to drive the plasma and the etching process. A focus ring may be added to focus or concentrate the reactive ions or free radicals. A computer based controller controls the operation according to a program of instructions which reflects the required times, temperatures and other processing conditions required for etching particular films. The process may be even further automated by adding a robot which places wafers in the chamber from a previous process or storage location and removes the wafers after etching for a subsequent process step. A well designed etching process will commonly produce very high yields across the entire wafer surface.

In semiconductor processes, while reduction in yield loss is always one goal of process improvement, small levels of yield loss have been tolerated as normal. A large yield loss is not tolerated and processing equipment will be taken off line while a yield problem is isolated and corrected. In the case of intermediate yield losses, attempts at resolution are made by various unscheduled maintenance procedures. For example, in a plasma etching process, adjustments to back side cooling pressures or process gases can temporarily improve the problem. These adjustments, however, may be masking the true source of the problem and are not a long term solution to eliminate yield loss.

Accordingly, there is a need for an improved method for reducing process yield loss in semiconductor processing.

BRIEF SUMMARY

By way of introduction only, the presently disclosed embodiments improve the accuracy of wafer placement in a semiconductor processing chamber. In a first aspect, wafer edge yield loss for a particular process or device is correlated with precision mechanical placement of a wafer in the device. A precision placement is determined and used for calibration of a wafer placement robot. In a second aspect, an alignment method for semiconductor processing equipment confirms the precision placement of the wafer, for example, during each preventative maintenance operation. Correct placement, or calibration, is confirmed optically by comparing wafer placement with a specially adapted alignment jig. The calibrated location is then used by the wafer placement robot.

The foregoing discussion of the preferred embodiments has been provided only by way of introduction. Nothing in this section should be taken as a limitation on the following claims, which define the scope of the invention.

DETAILED DESCRIPTION OF THE DRAWINGS AND THE PRESENTLY PREFERRED EMBODIMENTS

A need for a precision handoff originated from a wafer edge yield problem on a deep trench silicon plasma etch process. Initially, an early detection of yield loss was correlated with Scanning Electron Microscope (SEM) profiles at specific edge locations on wafers subjected to the plasma etch process. Using this method, experiments were completed to test theories of process kit hardware and wafer placement errors in the process chamber. The kit hardware includes structures maintained in the process chamber with a wafer, such as a focus ring.

The direction of wafer misalignment in very small increments (±0.05 mm) with respect to the electrostatic chuck (ESC) was correlated to measurements obtained from the SEM, which were correlated to the specified yield loss. No correlation was discerned by offsetting the placement of the focus ring with respect to the ESC.

Because of the pattern or shape of the yield loss region one of two possible root causes were identified. An awareness of the effect of improper wafer cooling such that the raised temperature of portions of the wafer in the process chamber was believed to be a cause of the yield loss. This is due to either the wafer positioning on the fluid cooled ESC or to the effect of the separation from the nearest process kit parts. The consumption of the process kit part during normal operation of the etch process chamber was also suspected as causing the systematic yield loss. In both cases, the process kit part is quartz, but in other applications, the part could be another common material such as ceramic (alumina) or silicon.

In the first case, it was considered that these parts get very hot in the plasma etch environment and overheat the edge of the wafer. However, it was found that the wafer edge farthest from the process kit part was the affected edge of the silicon wafer. Experimental results show that the kit parts in this case, although hot, actually act as a heat sink for the very hot wafer edge which overhangs the ESC by 2 mm. The quartz rests on the fluid cooled ESC which is constantly removing heat from the part and from the wafer.

In the second case, the combination of the offset of the wafer on the quartz kit part, also called the focus ring, puts the wafer in an undesirable position with respect to process gasses generated during the consumption of the process kit part during the plasma etch process. In the consumption of the process kit part, specific byproducts are generate which take part in the etch process. With a process that has been optimized around the consumption of the process kit parts, increasing the distance between the silicon wafer and the process kit part decreases the contribution of the byproducts generated during the etch process. With the decrease in the contribution of the byproducts, the systematic yield loss will be realized every time that the silicon wafer and the process kit part are not correctly aligned.

Also noted in the investigation was that the quantity of yield loss increased through the preventative maintenance (PM) cycle of the plasma etch chamber if the placement of the silicon wafer was not precisely in the center of the ESC. Preventative maintenance is performed periodically, such as once a month. It was theorized that the consumption of the process kit parts not only contributed as a change of heat transfer effects, but also the process chemistry at the edge of the wafer changes based on the species liberated from the quartz. These species liberated from the ring have less of an opportunity to be part of the process gas due to the increased distance from the wafer.

Prior methods of wafer placement calibration did not allow for the improvement of wafer placement accuracy needed to insure wafer yield improvement. Wafer alignments in the development chamber were previously performed by visual placement of the wafer in a chamber under vacuum. The wafer was required to be aligned without optical enhancement to tolerances of ±0.15 mm with a 3 lobed alignment jig. With this method, the accuracy cannot be improved beyond ±0.15 mm reliably and the wafer is often mistakenly aligned outside the jig boundaries. A wafer slightly outside the perimeter of the jig may fall into the alignment pocket making the appearance that the handoff is acceptable. Other methods of alignment involve the use of jigs whereby a pin is dropped through a hole, aligning it with a hole in the robot arm. Tolerances are limited with this method, and over time increase in error due to mechanical wear.

To improve the ability to align the wafer in the required tolerances, a microscope was selected as an optical enhancement device to provide consistent wafer alignment within the alignment jig. For one application, a Peak Long Distance Microscope LDM 40 magnifying microscope, available from Peak Optics, was selected. This magnifying microscope has an 8–12 inch focal distance (distance between the clear vacuum cover and the wafer edge) and has been fitted with a measuring reticle to aid in the precision placement of the measurements.

The 200.3 mm, three lobe alignment jig was also replaced with a 200.2 mm, 4 lobe alignment jig. The four lobes provide better alignment resolution by increasing the reference points to match the degrees of freedom of the robot movement—positive and negative reach direction and positive and negative theta rotation. The objective is to adjust the wafer so that there is equal spacing between the wafer edge and the alignment jig at each of the lobes.

Wafer placement accuracy is optimized with this method and associated edge yield loss on all parts processed in the chamber is eliminated.

Figure 1:
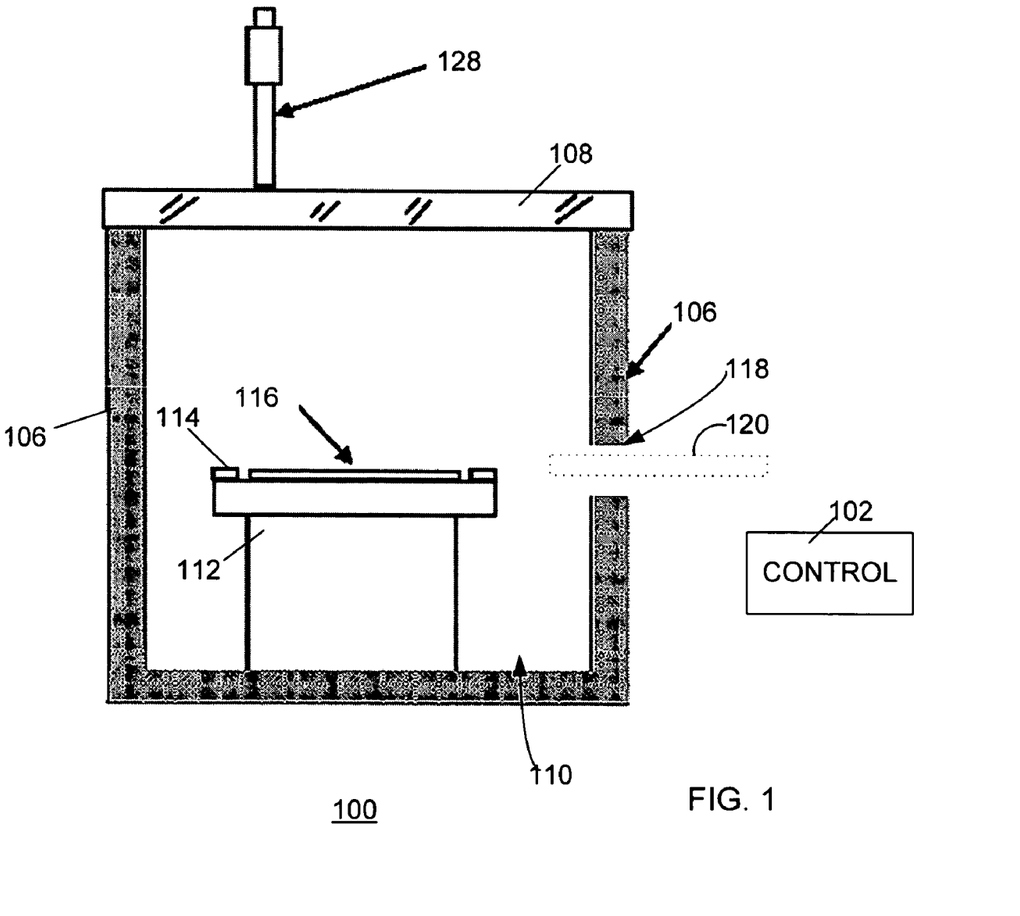
FIG. 1 is a view of a plasma etcher.

Referring now to the drawing, FIG. 1 is an elevation view of a plasma etcher 100. The plasma etcher 100 includes a process chamber 102 and a controller 104. The process chamber 102 includes walls 106 and a lid 108 which define a plasma etching space 110. The plasma etcher 100 also includes equipment such as fluid control equipment for evacuating and filling gases in the process chamber 110, a radio frequency (RF) energy source for the plasma process, a focus ring or other kit parts for focusing RF energy in the process chamber 110, and thermal processing equipment for cooling the process chamber 110 and its contents.

The controller 104 includes one or more processors and memory. The memory stores data and instructions for controlling the plasma etching process in the process chamber. In one embodiment, the plasma etcher 100 is a plasma etching system manufactured and sold by Tokyo Electron, Ltd., Tokyo Japan. Other similar equipment may be substituted and other types of semiconductor processing equipment may benefit from the methods and apparatus disclosed herein.

Contained within the process chamber 110 is an electrostatic chuck (ESC) 112. Arranged on the ESC 112 is an alignment jig 114 and a semiconductor substrate or wafer 116.

The ESC 112 may be made of any suitable material. However, because plasma etching is a high-temperature process, and because thermal uniformity across the wafer 116 is important to consistent etching of the film on the wafer surface, the ESC 112 may be made of thermally conductive material such as aluminum or aluminum nitride. The ESC 112 is also cooled, for example, by flowing a liquid coolant within the ESC 112 to convey heat from the back side of the wafer 116 to manage thermal environment of the wafer 116.

The ESC 112 is employed to retain the wafer 116 during the plasma etching process. The wafer 116 is placed with its back side in mechanical contact with the ESC 112. While the methods and apparatus disclosed herein are useful in a wide variety of semiconductor processing applications, the preferred embodiment of the drawing is a plasma etching process. In plasma etching, after formation of a film on the front side of the wafer 116 such as silicon dioxide, a pattern is formed using conventional photolithographic processes. The wafer is then placed in the process chamber 110 and a plasma gas is introduced to the chamber 110. Upon suitable application of RF energy, the plasma ions are propelled to the surface of the wafer 116 and remove exposed portions of the surface film. Upon completion of the process, the wafer 116 is removed from the chamber 110.

For positioning the wafer 116 in the process chamber 110 and removing the wafer 116 from the chamber 110, the wall 106 defines an opening 118 and a robot arm 120 is extendable through the opening 118 to engage the wafer 116.

Exemplary robot systems are manufactured by Yaskawa Electric Corporation of Japan. In some applications, the robot arm 120 selects the wafer from a wafer cassette used to store and transport a group of wafers. The robot arm 120 operates under control of a control system which includes a software program controlling a processor which in turn controls actuators which precisely move and place the robot arm 120. The robot control system may be programmed with the location at which the wafer 116 is to be placed on the ESC 112 and in future process cycles, the robot will place the wafer 116 at the programmed location with extreme precision, a process referred to as handoff. The robot's position is defined by two variables, reach or R and angle or theta or Th. One aspect of regular maintenance and inspection of the plasma etcher 100 is verifying the programming of the handoff location by the robot arm 120.

Figure 2:
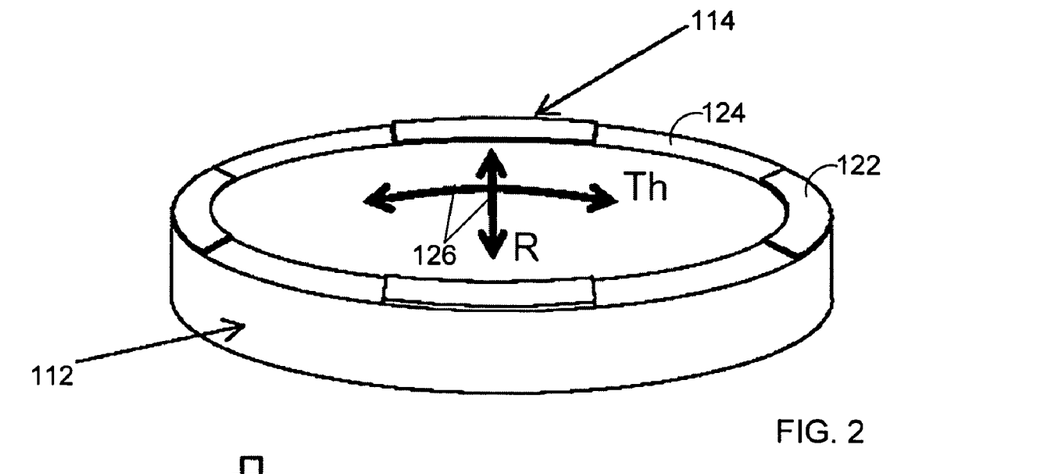
FIG. 2 is a view of an alignment jig positioned on an electrostatic chuck for use in the plasma etcher of FIG. 1.

FIG. 2 is an isometric view of the alignment jig 114 positioned on the electrostatic chuck 112. In a typical application, the alignment jig 114 is used during the regular maintenance and inspection (such as preventative maintenance) of the plasma etcher 102 to precisely align or re-align the robot arm 120 for subsequent operation. The alignment jig 114 is round to match the top of the ESC 112. The alignment jig 114 includes alignment lobes 122 which are upraised portions of the rim 124 of the jig 114 and provide improved visibility during the process of aligning the robot arm to the ESC 112. The jig 114 further includes alignment markers 126 to indicate correct orientation of the jig 114 to the R and theta movement directions of the robot arm.

In the past, an alignment jig with three alignment lobes and a diameter of 200.3 mm was used for alignment of the robot arm used for processing wafers having a diameter of 200 mm. The convention alignment jig 114 was placed on the ESC and visually aligned within a calibrated diameter ring, or by another method. The 200.3 mm conventional jig left a total space of 0.3 mm between the inner edge of the jig and the outer edge of the wafer. This conventional alignment jig and alignment process yielded a maximum alignment precision of ±0.15 mm. However, it has been discovered that misalignment greater than ±0.05 mm will cause substantial yield loss on a deep trench etch process for a 200 mm wafer.

In accordance with the present applications, the alignment jig 114 has been developed to enhance the precision of wafer placement alignment to thereby reduce or eliminate process yield loss during plasma etching. Thus, the alignment jig 114 includes four lobes 122. The lobes are used for visually aligning the wafer and ESC 112. Previously, a three lobe alignment jig was used in which three identical lobes were place uniformly around the perimeter of the rim of the jig. However, the three alignment lobes were not positioned where they could usefully assist a technician trying to align the robot arm and wafer. The four lobe alignment jig 114 has four lobes also positioned uniformly around the perimeter of the rim 124 of the jig 114. The four lobes, however, are diametrically opposed so they can be used to assist the technician aligning opposed edges of the alignment jig to the wafer.

Further, the alignment jig 114 has a diameter of 200.2 mm. This narrowed diameter relative to the 200 mm wafer reduces the total space between the wafer outer edge and the jig 114 inner edge to 0.1 mm, increasing the likelihood of aligning the robot arm within the desired tolerance of ±0.05 mm. However, for some technicians, visually resolving this small tolerance is difficult.

Figure 3:
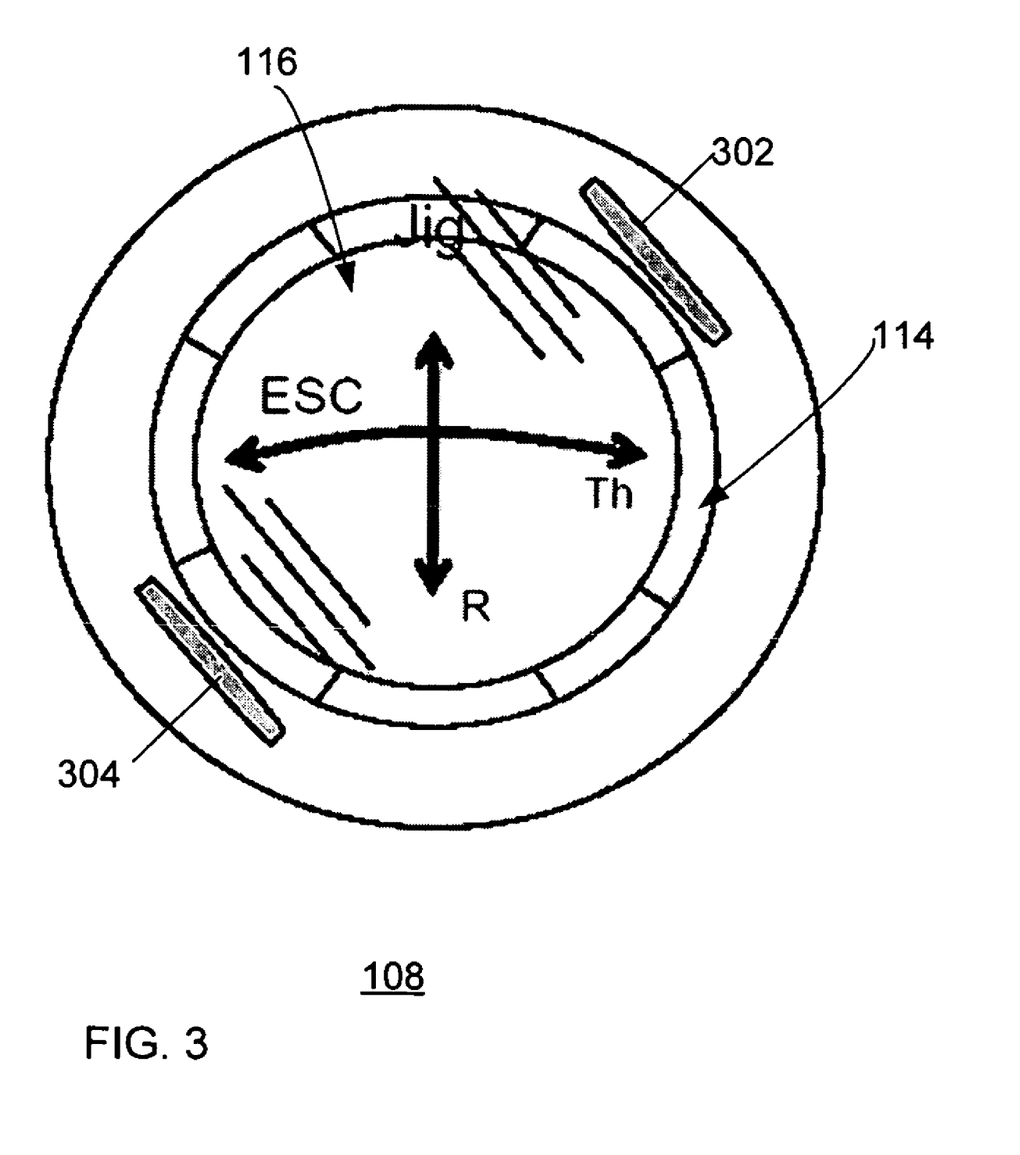
FIG. 3 is a top view of a clear lid for use in wafer placement calibration in the plasma etcher of FIG. 1.

FIG. 3 shows a clear lid 108 placed on the process chamber 1–10 and a view of the alignment jig 114 and wafer 116 below, inside the chamber 114. The lid 108 includes handles 302, 304 for carrying the lid 108. The clear lid 108 replaces the conventional lid of the plasma etcher 100 during the periodic maintenance process. The conventional lid is part of the process chamber 110 and must withstand a vacuum in the chamber 110. The conventional lid prohibits seeing within the chamber 110 to align the robot arm 120. Substituting the clear lid 108 permits viewing of the alignment jig 114 and the wafer 116 for alignment.

The distance from the lid 108 to the wafer is approximately 8–10 inches. This distance can make precise alignment difficult. The distance between the alignment jig 114 and the wafer edge is less than 0.1 mm, as noted. If viewed from an angle rather than directly from above, the apparent space can be even less and even more difficult for a technician to resolve.

Accordingly, the embodiment of FIG. 1 includes a measuring microscope 128 which may be placed above the see-through lid 108 during the alignment process. In one exemplary application, a Peak Long Distance Microscope LDM 40 magnifying microscope, available from Peak Optics, was selected. This microscope has an 8–12 inch focal distance, corresponding to the distance between the lid 108 and the wafer 116. Further in this embodiment, a measuring reticle is used with the microscope 128 to increase the precision of the measurement. Other suitable optics may be used.

Figure 4:
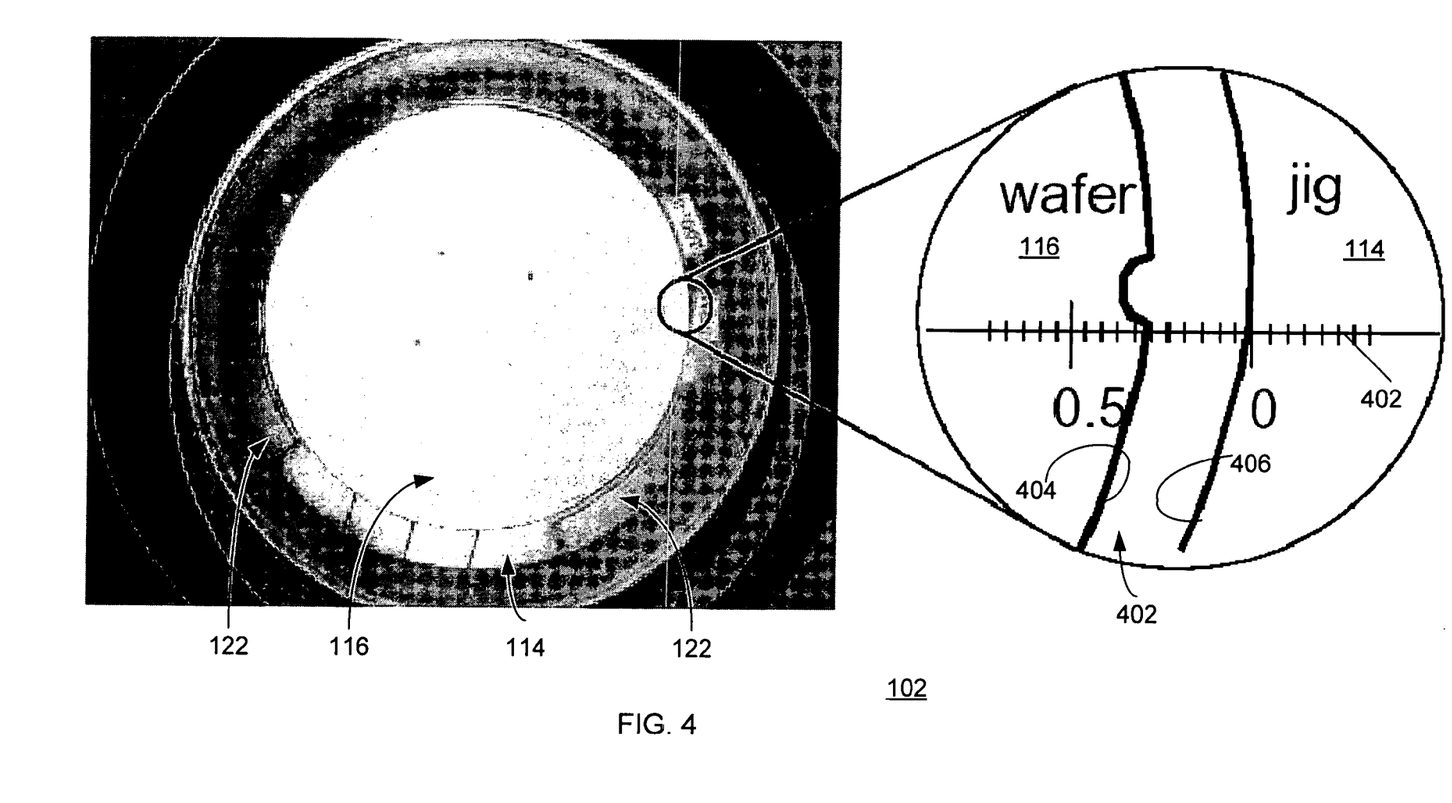
FIG. 4 is a photograph through the clear lid of FIG. 3 of the alignment jig of FIG. 2 in the plasma etcher of FIG. 1.

FIG. 4 shows a view through the microscope 128 during an alignment process. Visible are the wafer 116 and the alignment jig 114 and the space 402 between the outer edge 404 of the wafer 116 and the inner edge 406 of the jig 114. In this embodiment, the alignment jig 114 is actually a three lobe jig, having three lobes 122 positioned equally around the perimeter of the jig 114, rather than the four lobe jig of FIG. 1.

Also visible in FIG. 4 is the measuring reticle 408. The reticle 408 is calibrated to measure lengths of 0.005 mm so that the distance between the edge of the jig 114 and the edge of the wafer 116 can be measured. It is not necessary to have calibrated divisions as the technician will only be making a comparison of divisions from one side of the wafer to the opposite side. It is only important to have some amount of divisions in the measurement such that the comparison between the two opposite sides of the wafer can be made with good resolution.

In other applications, where other spaces are provided or other tolerances are required, other devices may be substituted. For example, instead of a reticle with 0.005 gradations to allow measurement of the space, a reticle marked to show a standard space, such as 0.05 mm, may be used. The standard space may be shown as two centered vertical lines, or as a box or as a combination of vertical lines and spaces. In that case, instead of measuring and comparing distances on opposed sides of the wafer, a technician may merely confirm that the space 402 is less than the standard space visible on the reticle 408.

Figure 5:
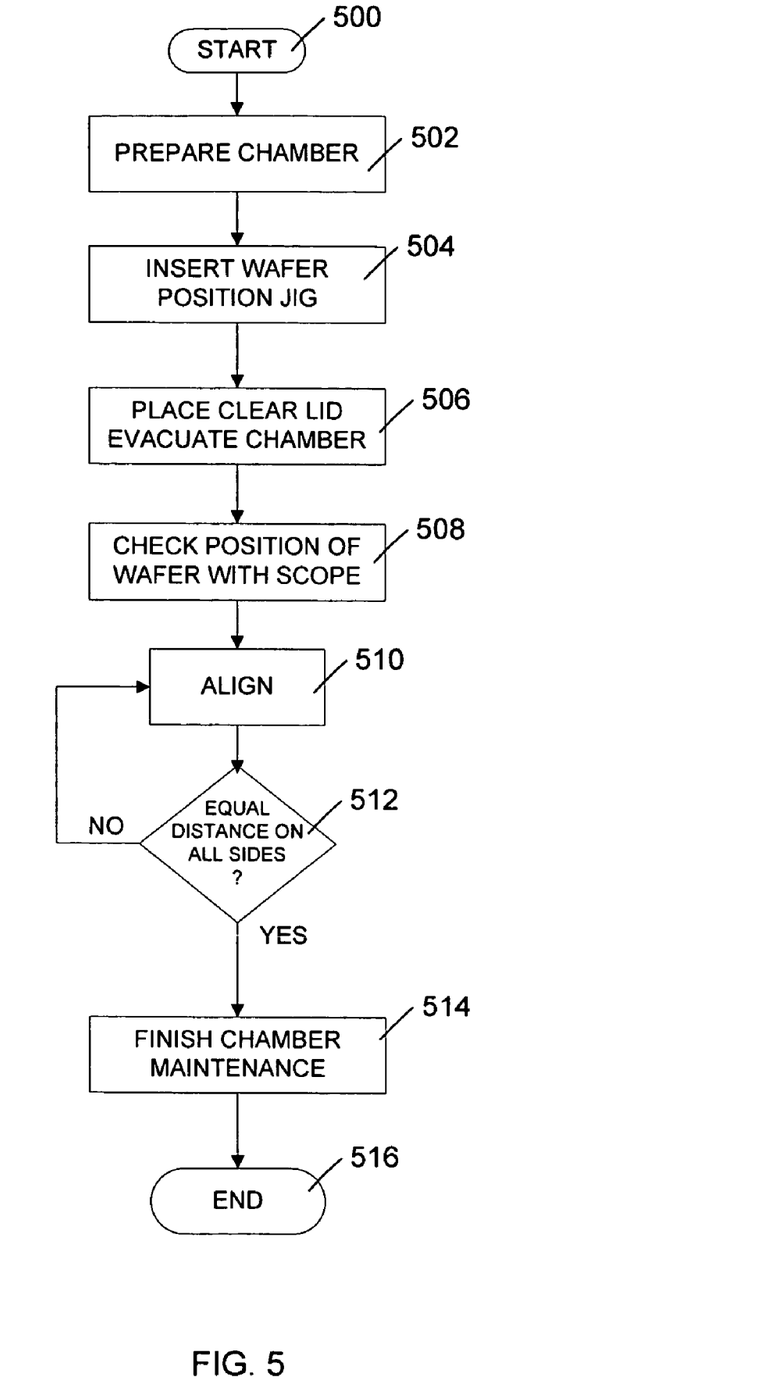
FIG. 5 is flow diagram illustrating an alignment method for semiconductor processing equipment.

FIG. 5 is flow diagram illustrating an alignment method for semiconductor processing equipment. The method of FIG. 5 may be performed in conjunction with a plasma etching system such as the plasma etcher 100 of FIG. 1, and the explanation below assumes that is the desired application. Accordingly, the goal of the method of claim 5 is to align a robot arm to place a semiconductor wafer in a plasma etcher process chamber with repeatable high precision (e.g., within 0.05 mm). Alternatively, the method of FIG. 5 may be performed in conjunction with any other semiconductor processing equipment. The method begins at block 500.

At block 502, the process chamber is prepared. In one application, the method of FIG. 5 is performed during a periodic maintenance procedure, such as monthly preventative maintenance (PM). Among the procedures required for chamber preparation are adjusting the temperature of the chamber and/or the electrostatic chuck, isolating and venting the chamber, removing the focus ring, if present, and removing the lid, referred to as an upper depo-shield.

At block 504, a wafer positioning jig is inserted on the electrostatic chuck in the process chamber. This is preferably a jig such as jig 114 which has been adapted to facilitate precise alignment of the plasma etcher, for example, by being sized slightly larger than the wafers to be processed in the chamber and by including four alignment lobes. If the four lobe jig is used, the four lobes should be positioned so that they align with the +R and −R directions (i.e., along the reach movement) of the robot arm and with the +Th and −Th directions (along the rotational arc of the robot arm).

At block 506, the clear lid is placed on the process chamber. Use of the clear lid allows a technician to see into the process chamber from above for aligning the robot arm.

At block 508, a wafer is placed in the plasma etcher and the position of the wafer is verified with a measuring microscope. In one embodiment, the wafer is a dummy wafer used solely for the purpose of aligning the plasma etcher. Alternatively, the alignment may be performed using a wafer to be processed. The wafer is moved to its alignment point by the robot arm. The technician uses the microscope or other suitable magnifying device and observes the space between the edges of the wafer and the surrounding edges of the alignment jig. In one embodiment, the technician compares the spaces on two diametrically opposed sides along the +R and −R axis and similarly compares the spaces on two diametrically opposed sides along the +Th and −Th axis. More spacings at more areas of the wafer edge may be observed other than the four described here. Alternative, if a four lobed alignment jig is not used or not available, any set of edge locations may be used to provide the necessary precision. In another embodiment, the spaces at these locations are measured using a measuring reticle of the microscope and the measurements are compared. Other position verification techniques may be used as well. Alternatively, the spacings are reduced at the four perimeter locations below a placement precision tolerance which has been selected to minimize yield loss when processing subsequent wafers in the etcher or other processing equipment.

At block 510, the robot arm alignment is confirmed. The position of the wafer is adjusted relative to the electrostatic chuck and the alignment jig to minimize variation among the spacings between the edge of the wafer and the alignment jig at, for example, four perimeter location In one embodiment, the technician determines if the spaces on the opposing sides along the two axes are substantially the same by comparing with a standard space visible through the microscope, adjusting the position of the robot arm until the space on the opposing sides is within a visual tolerance. In another embodiment, after measuring the spaces, the technician adjusts the position so that the measurements at all of the opposing sides are within a measurement tolerance, such as 0.05 mm. Once the position is adjusted and confirmed, the robot is programmed with the adjusted position for use when placing subsequent wafers in the plasma etcher.

At block 512, it is determined if the wafer position is equally distant from the alignment jig on all sides. If not, the method returns to block 512 to realign the robot arm. Confirming alignment may also involve lowering the wafer onto the electrostatic chuck to confirm final alignment of the wafer on the chuck. The centering of the wafer can be re-verified in that position. If the position is precisely aligned, data defining the position can be stored in the memory of the control system of the robot arm. This position data will be used subsequently during production to precisely place wafers in the stored position.

Some robot arms include two forks for separately holding two wafers, in order to increase productivity and throughput. If such is the case, blocks 508, 510 and 512 may be repeated to align the other fork of the robot arm.

Otherwise, control proceeds to block 514 to finish chamber maintenance. In one example, this includes venting the chamber and cleaning the chamber, if necessary, removing the positioning jig and re-installing the focus ring, removing the clear lid and re-installing the upper depo-shield, closing the lid and pumping down the chamber.

Figure 6:
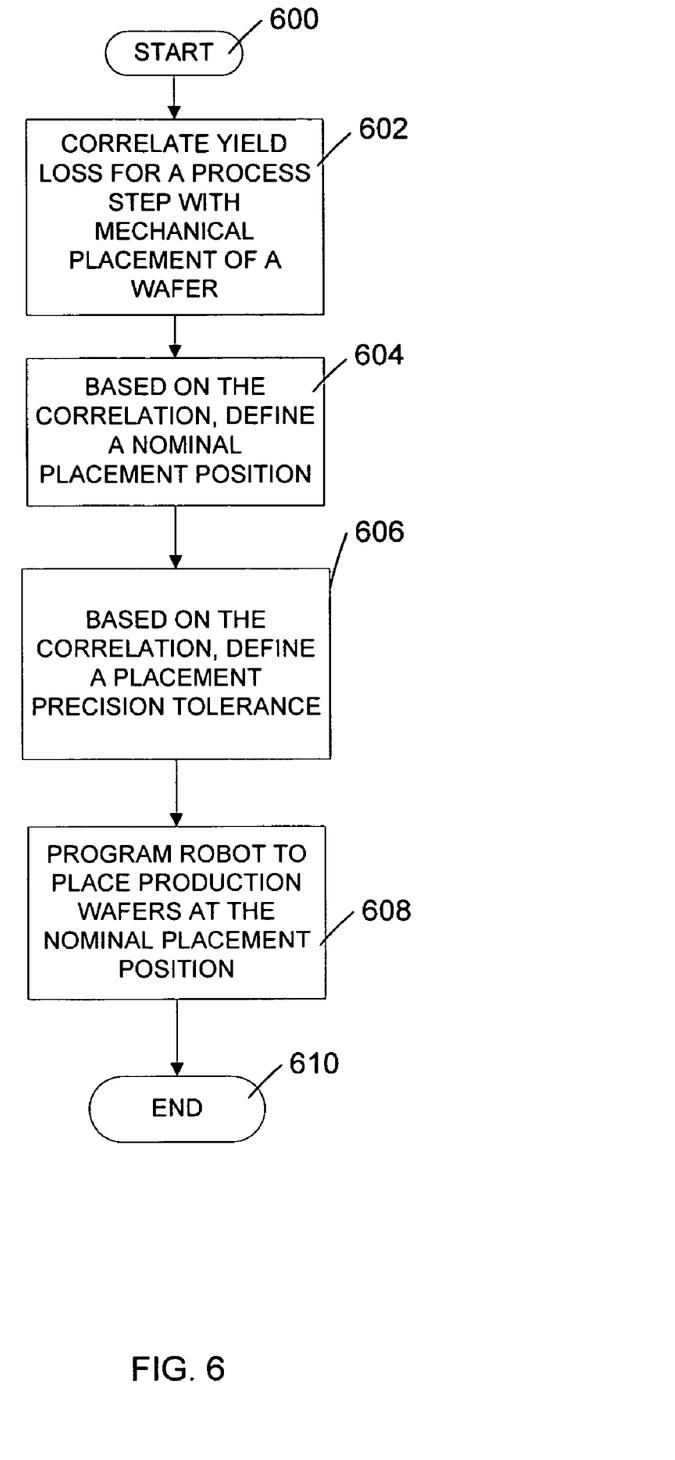
FIG. 6 illustrates a method of enhancing production yield for a semiconductor manufacturing process.

FIG. 6 illustrates a method of enhancing production yield for a semiconductor manufacturing process. The method begins at block 600. At block 602, the yield loss for the performance of a processing step in a semiconductor manufacturing process is correlated with mechanical placement of a wafer. In the exemplary embodiment described herein, the processing step is a plasma etching step and particularly a plasma etching step to produce deep trenches on a film such as silicon dioxide on a surface of a wafer. However, the method may be extended to other process steps as well, particularly those that require precision placement of the wafer in a process chamber by a robot.

The correlation of block 602 may be achieved by any suitable method. For example, the processing step such as plasma etch may be performed for a number of test wafers. The test wafers are then tested to identify defects occurring during performance of the processing step as well as the locations on the wafers of the defects. At the same time, the respective alignment positions, or relative misalignments, of the test wafers are identified. In this manner, the locations of the defects may be associated with the alignment positions so that patterns may be detected. In one example, it was determined that an off-center misalignment of more than 0.05 mm produced a crescent-shaped area of defects on a wafer edge. Other types of defect analysis and statistical manipulation may be used as well to correlate failures with misalignment.

At block 604, based on the correlation of block 602, a nominal placement position is defined. This may be a position that, for example, is centered on the electrostatic chuck of a plasma etcher. Alternatively, the position may be offset from the center or be in some other way non-uniform, while accounting for the yield loss detected in block 602. Similarly, at block 606, a precision placement tolerance is defined based on the correlation determined in block 602. The tolerance will generally be a value by which the wafer position may be displaced from the nominal placement position of block 604 while still maintaining acceptable yield loss for the process step.

Finally, at block 608, the wafer placement robot is programmed to place production wafers at the nominal placement position of block 604. This position will be used subsequently during handoff of wafers from the robot to the plasma etcher.

From the foregoing it can be seen that the present embodiments provide an improved method for reducing process yield loss in semiconductor processing. Mechanical placement of a wafer is correlated with yield loss occurring during performance of a particular process step. A nominal position and tolerance are defined and subsequently used during performance of the process step. During periodic maintenance operations, a process is used to align the process equipment with high precision to the nominal position, and realign if necessary. The effect is a significant improvement in yield by reducing defects that occur during the process step. A second effect is improving the availability of the process equipment, which no longer experiences frequent down time during diagnostic and realignment processes.

It is therefore intended that the foregoing detailed description be regarded as illustrative rather than limiting, and that it be understood that it is the following claims, including all equivalents, that are intended to define the spirit and scope of this invention.

The invention claimed is:

1. A method for processing a semiconductor substrate, the method comprising:
   correlating yield loss for performance of a processing step in a semiconductor manufacturing process with mechanical placement of the semiconductor substrate;
   based on the correlation, defining a nominal placement position;
   based on the correlation, defining a placement precision tolerance; and
   during subsequent performance of the processing step, placing semiconductor substrates at the normal placement position within the placement precision tolerance.

2. The method of claim 1 wherein the processing step comprises a plasma etching step and wherein the placement precision tolerance is less than or equal to ±0.05 mm from the nominal position.

3. The method of claim 1 further comprising: programming a substrate handling robot to place the semiconductor substrates at the nominal placement position within the placement tolerance.

4. The method of claim 1 wherein correlating yield loss comprises:
   for a plurality of test substrates, performing the processing step;
   identifying defects occurring during performance of the processing step and locations of the defects on the test substrates;
   identifying alignment positions of the test substrates; and
   associating the locations of the defects and the alignment positions.

5. The method of claim 1 further comprising determining the yield loss for performance of the processing step in the semiconductor manufacturing process.

6. The method of claim 1 wherein correlating yield loss comprises:
   performing the process steps for a number of test substrates;
   testing the test substrates to identify defects and location of the defects on the test substrates;
   identifying respective alignment positions of the test substrates; and
   associating the location of the defects with the alignment positions.

7. The method of claim 1 further comprising identifying patterns of defects with alignment positions.

8. The method of claim 1 wherein defining a nominal placement position comprises:
   defining a position centered on a wafer support in a processing device.

9. The method of claim 1 wherein defining a nominal placement position comprises:
   defining a position offset from a center of a wafer support in a processing device.

10. The method of claim 1 further comprising programming a wafer placement robot to place semiconductor substrates at the nominal position during the subsequent performance of the processing step.

11. A method for processing a semiconductor substrate, the method comprising:
    processing a set of test wafers in a processing device;
    identifying defects occurring in the test wafers during the processing of the test wafers to establish a yield loss;
    identifying respective alignment positions or relative misalignments of the test wafers with respect to a wafer support during the processing of the test wafers to establish mechanical placement of respective test wafers;
    correlating the yield loss with the mechanical placement of the test wafers;
    based on the correlation, defining a nominal placement position for a production wafer with respect to the wafer support during subsequent processing of the production wafer in the processing device;
    based on the correlation, defining a placement precision tolerance for the production wafer with respect to the wafer support during subsequent processing of the production wafer in the processing device; and
    during subsequent processing in the processing device, placing production wafers substantially at the normal placement position within the placement precision tolerance.

12. The method of claim 11 further comprising:
    using the nominal placement position, programming a wafer placement robot to place the production wafers during the subsequent processing in the processing device.

13. The method of claim 11 wherein defining a nominal placement position comprises identifying a position at a center of the safer support or offset from the center while accounting for the yield loss.

* * * * *